United States Patent
Morini et al.

(10) Patent No.: US 6,809,553 B2
(45) Date of Patent: Oct. 26, 2004

(54) DIGITAL LEVEL SHIFTER WITH REDUCED POWER DISSIPATION AND FALSE TRANSMISSION BLOCKING

(75) Inventors: Sergio Morini, Pavia (IT); Massimo Grasso, Pavia (IT)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/975,946

(22) Filed: Oct. 15, 2001

(65) Prior Publication Data

US 2003/0071655 A1 Apr. 17, 2003

(51) Int. Cl.[7] .......................................... H03K 19/0175
(52) U.S. Cl. ............................ 326/80; 326/81; 327/333
(58) Field of Search ............................. 326/80, 81, 63; 327/333; 363/60

(56) References Cited

U.S. PATENT DOCUMENTS

| | | |
|---|---|---|
| 4,942,309 A | 7/1990 | Chieli |
| 5,742,183 A * | 4/1998 | Kuroda .......................... 326/81 |
| 6,362,679 B2 | 3/2002 | Wile |

* cited by examiner

Primary Examiner—Daniel Chang
(74) Attorney, Agent, or Firm—Ostrolenk, Faber, Gerb & Soffen, LLP (57) ABSTRACT

A circuit including a level shifting device such as a high voltage MOS device which is turned on to make an output transition, and feedback circuitry which responds to the transition to turn off the level shifting device. A circuit including two n-channel devices and two p-channel devices can sense when current greater than a threshold flows through both devices of one channel type to prevent false output transitions due to rapid changes in offset voltage, or both features can be provided. Level shifting devices can also be connected so none of the devices receives its acknowledge signal from the device to which it provides an acknowledge signal to avoid a standoff between two devices. For each device, the feedback circuitry can distinguish acknowledge signals so a device that stops transmitting in response to a signal that was not an acknowledge signal cam be restarted.

21 Claims, 5 Drawing Sheets

FIG.1A
PRIOR ART

Compare Level Shifter

DIGITAL LEVEL SHIFTER WITH REDUCED POWER DISSIPATION AND FALSE TRANSMISSION BLOCKING

BACKGROUND OF THE INVENTION

1. Field of the Invention

The present invention relates to a digital level shifter circuit that has circuitry to reduce power dissipation or to block false transmission due to rapid changes in offset voltage.

2. Description of the Related Art

Digital level shift circuits typically translate a digital signal generated by a low voltage input power supply $V_{DD}$ to a digital signal that is offset from the low input voltage by a relatively high voltage which can change rapidly. The function of a digital level shifter is illustrated in FIGS. 1A and 1B, in which unshifted circuit 10 (FIG. 1A) can be compared to shifted circuit 12 (FIG. 1B).

Figure 1A:
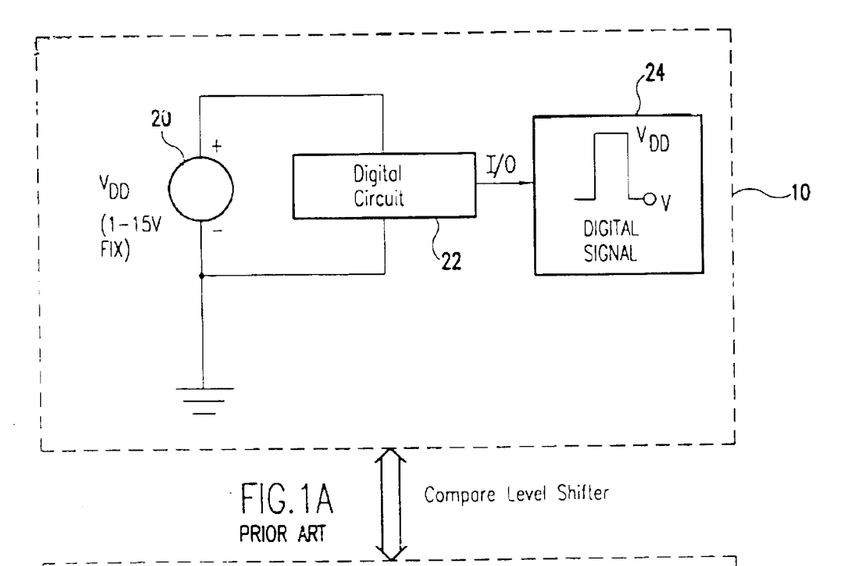

In unshifted circuit 10, shown in FIG. 1A, voltage source 20 provides low voltage $V_{DD}$ across digital circuit 22, relative to ground. $V_{DD}$ can, for example, be any appropriate fixed voltage between 1V and 15V. Digital circuit 22 in turn provides a digital signal at its output (I/O) that switches between 0V and $V_{DD}$, as shown in box 24.

Figure 1B:
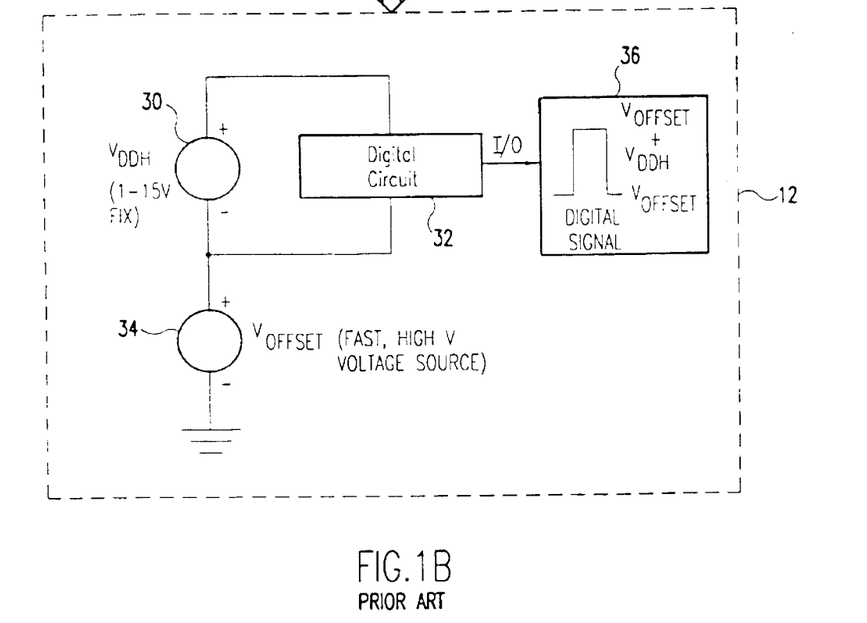
FIG. 1B shows a level shifted digital circuit.

In shifted circuit 12, shown in FIG. 1B, voltage source 30 similarly provides a digitally varying voltage $V_{DDH}$ across digital circuit 32, but is offset from ground by a level determined by an offset voltage source 34 connected between ground voltage from voltage source 30 and ground. Offset voltage source 34 is a fast, high voltage source that provides $V_{OFFSET}$. As a result, digital circuit 32 provides a level shifted digital signal at I/O that switches between $V_{OFFSET}$ and $V_{OFFSET}+V_{DDH}$, as shown in box 36.

Integrated digital level shifters are typically implemented with a high voltage N-channel MOS device to shift signals from the low side to the high side. To shift in the other direction, a P-channel device is necessary.

Two main problems arise in integrated digital level shifters-power dissipation and false transmission due to fast changes in $V_{OFFSET}$ (also referred to as "the dv/dt problem").

In an integrated circuit (IC), $V_{OFFSET}$ can be as high as 1200V. Therefore, even if the high voltage level-shifting transistor sinks a relatively small current of only 1 mA when on, the power dissipation is 1.2 W, which is a large amount of power to be dissipated in an IC. This power dissipation problem has been solved in the past by transmitting only short pulses at signal transitions, level shifting these pulses and then using these pulses at the shifted voltage level to reconstruct the signal.

Figure 2:
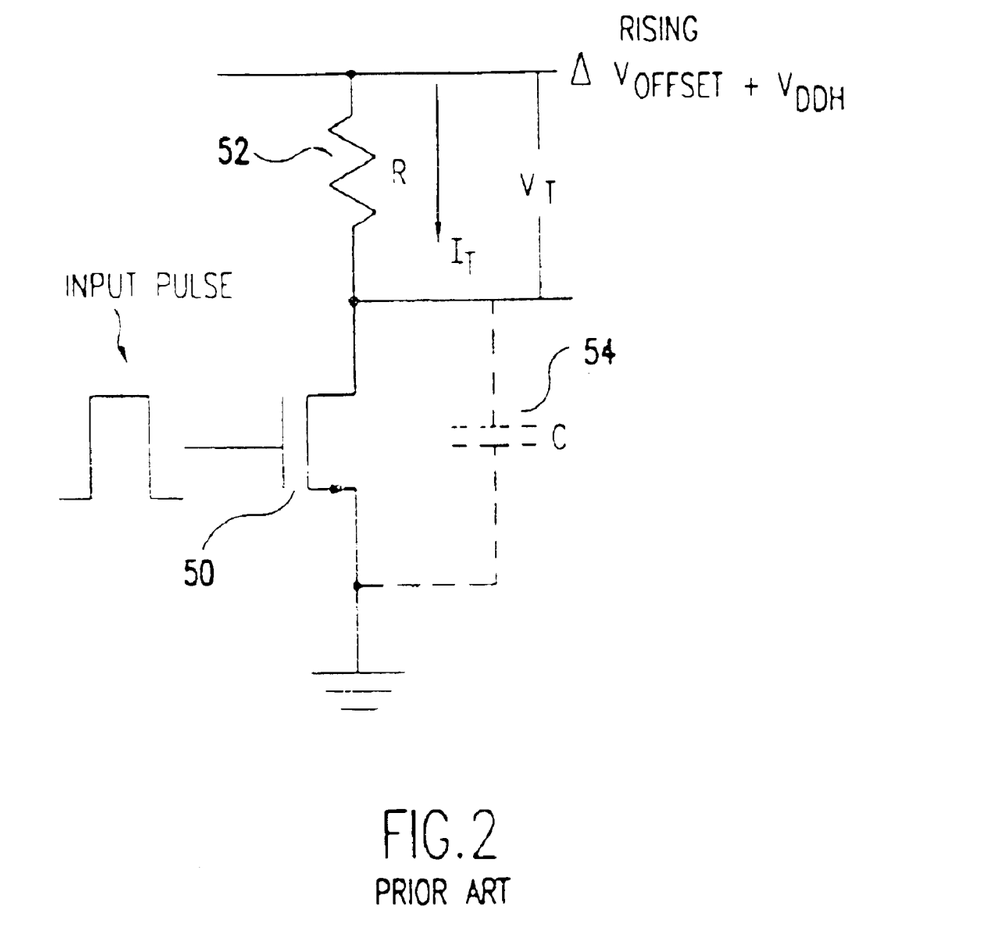
FIG. 2 is a schematic circuit diagram showing how a current through a transistor due to changing offset voltage can produce false transmissions.

The dv/dt problem can be understood from FIG. 2, showing a high voltage level shift N-channel transistor 50 connected to an output signal line through resistor 52, having the value R. Transistor 50 has a parasitic capacitance 54 having the value C. Therefore, during the fast rising edge of $V_{OFFSET}$ transistor 50 passes a current $I_T=C*dv/dt$. As a result, a pulse-like voltage $V_T=R*C*dv/dt$ will briefly develop across resistor 52. If $V_T$ exceeds the threshold voltage at which a transmitted signal is sensed, an error occurs.

To solve this dv/dt problem, three prior art solutions have been developed. The first solution is to use a pulse of current during transmission which is larger than the dv/dt current. However, for very fast dv/dt, such as 10V/nS, the required current would be so high that power dissipation would become impractical.

The second solution is to use a filter that cancels all shifting pulses having a duration less than a set value. This solution is based on the fact that if the derivative of $V_{OFFSET}$ is less than a certain value, the error current is limited and an error does not occur. If the derivative is greater than this value an error could occur, but its time duration is less than a time period of $(dV/dt)*(V_{OFFSET}(max)-V_{OFFSET}(min))$. The filter can, for example, cancel all pulses with duration less than this time period plus a protective incremental time. This solution has three main drawbacks: first, the time duration of a transmission impulse is so long that power dissipation is large; second, the error filter introduces delay even when the signal is good; and third, if the protective incremental time is not large enough, an error could be transmitted on slow dv/dt.

A third solution for the dv/dt problem is to use differential transmission. In this solution, the dv/dt error current is cancelled out as a "common mode" signal on the drain of two identical level shift transistors, while a good signal provides current through only one transistor, and hence is a "differential" signal.

SUMMARY OF THE INVENTION

The invention provides a new digital level shift circuit that alleviates the power dissipation problem. The new circuit includes feedback circuitry that obtains a feedback or "acknowledge" signal and, in response, turns off a level shifting device, limiting its on time. The acknowledge signal indicates that the device has made its output transition. As a result of this technique, power dissipation can be greatly reduced because the "on" time of the level shifting device can be dramatically shortened.

The feedback circuitry can be implemented with a feedback device that provides the acknowledge signal by turning on when the level shifting device makes its output transition. One of the two devices can be an n-channel device and the other can be a p-channel device. For example, the devices can be high voltage NMOS and PMOS transistors.

In addition to reducing power dissipation, the timing of the acknowledge signal can change in a self-adaptive way in response to changes in transmission speed, such as from process or temperature change.

Also, the new circuit can be implemented without a filter, overcoming the problem of filter delay.

To alleviate the dv/dt problem, the digital level shift circuit of the present invention uses a differential circuit implemented with two p-channel devices and two n-channel devices and a transmission protocol that avoids simultaneous transmission by two transistors of the same channel type. The new circuit includes sense/prevent circuitry that senses when current greater than a threshold flows through both devices of one channel type, as would happen when dv/dt causes current to flow through the parasitic capacitances of both devices. In response, the sense/prevent circuitry prevents transmission. For example, the sense/prevent circuitry can prevent the devices of the other channel type from receiving their turn-on signals.

The sense/prevent circuitry can include sensing logic that can provide a prevent transmission signal only when current is flowing through the series resistances of both devices of one channel type. The sense/prevent circuitry includes prevent transmission logic that receives the prevent transmission signal and, in response, inhibits the devices of the other channel type from receiving turn-on signals.

The digital level shift circuit of the present invention with two n-channel and two p-channel devices further preferably includes control circuitry that controls when each device receives its turn-on signal. The control circuitry can include both feedback circuitry and sense/prevent circuitry as described above.

In a further aspect, the present invention avoids timing problems that could arise with the turn-on signals.

One timing problem could occur if the turn-on signal of a device is received while the sense/prevent circuitry is preventing transmission because dv/dt is above threshold. To avoid this problem, the sense/prevent circuitry can include, for each device, a storage element that stores a turn-on signal or transmission pulse until the prevent signal ends and the acknowledge signal of the device is received. This will not occur until the current due to dv/dt again drops below threshold.

A second timing problem could occur if one n-channel device and one p-channel device initiate transmission concurrently. To avoid this problem, the feedback circuitry can provide a scheme in which the acknowledge signal for each device of one channel type comes from one of the devices of the other channel type, but with none of the devices receiving its acknowledge signal from a device whose acknowledge signal it provides. For example, if the first and second n-channel devices are n1 and n3 and the first and second p-channel devices are p1 and p3, n1 can provide the acknowledge signal to p1, p1 to n3, n3 to p3, and p3 to n1.

Under this scheme, one of two concurrently transmitting devices will stop transmitting because it will receive a high signal from the other device, but the signal will be a transmission, not an acknowledge signal. To solve this further problem, the control circuitry can also include feedback detection circuitry for distinguishing acknowledge signals from transmissions. This makes it possible to restart a device that stopped transmitting in response to a transmission.

Other features and advantages of the present invention will become apparent from the following description of the invention which refers to the accompanying drawings.

BRIEF DESCRIPTION OF THE DRAWINGS

FIG. 1A shows an unshifted digital circuit, while

FIG. 4 is a schematic circuit diagram showing a digital level shift circuit with circuitry that senses when current greater than a threshold flows through two p-channel level shifting transistors and, in response, prevents two n-channel level shifting transistors from turning on.

DETAILED DESCRIPTION OF THE PREFERRED EMBODIMENTS

Figure 3:
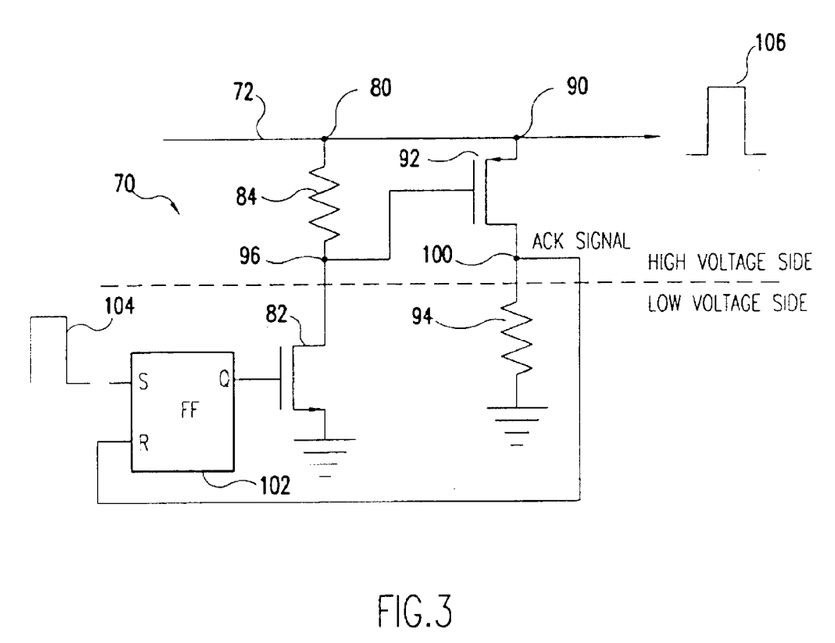
FIG. 3 is a schematic circuit diagram showing a digital level shift circuit with circuitry that obtains an acknowledge signal and, in response, turns off a level shifting transistor.

FIG. 3 shows the relevant components of a digital level shift circuit 70 of the present invention in which a feedback signal, referred to herein as an "acknowledge" signal, is used to drastically reduce power dissipation in a level shifting device such as a high voltage MOSFET or other suitable device. The device can be turned on and remain turned on only until its acknowledge signal is received, at which time the device is turned off.

In FIG. 3, circuit 70 provides level shifted output signals on line 72, which can, as illustrated in FIG. 1, provide a signal that varies from $V_{OFFSET}$ to $V_{OFFSET}+V_{DDH}$. Circuit 70 includes two current paths between line 72 and ground: In one current path, between node 80 and ground, level shifting n-channel transistor 82 is connected in series with resistance 84; in another current path, between node 90 and ground, p-channel transistor 92 is connected in series with resistance 94. The gate of transistor 92 is connected to receive the voltage at node 96, between transistor 82 and resistance 84. Transistors 82 and 92 are conventional high voltage (HV) MOSFETs, for example, but any other suitable devices could be used to implement circuit 70.

As shown, transistor 82 is the part of the circuit 70 that shifts signals from low to high; transistor 92 is the part of the circuit that shifts signals from high to low. Thus, to shift a signal from low to high, transistor 82 is turned on. As will be seen, when transistor 82 turns on, it remains turned on until an acknowledge signal is received.

Circuit 70 also includes circuitry that obtains the acknowledge (ACK) signal to provide feedback to transistor 82. The ACK signal is obtained at node 100, between transistor 92 and resistance 94, and is provided to the input R lead of SR flip-flop 102. The input S lead of flip-flop 102 is connected to receive signals that turn on transistor 82, illustrated by transmission pulse 104, and the output Q lead is connected to the gate of transistor 82.

The manner in which the ACK signal turns off transistor 82 can be understood from operation of circuit 70: When transmission pulse 104 sets flip-flop 102, its Q output goes high, turning on transistor 82 so that current can flow from line 72 through resistance 84 and transistor 82 to ground. As a result of this current, voltage rises across resistance 84. This can cause a transition in the output signal on line 72, as illustrated by transmitted pulse 106, while voltage at node 96 drops relative to line 72. Therefore, the gate of transistor 92 is at a lower voltage than line 72, turning on transistor 92. Transistor 92 thus detects that the output transition has been received.

When transistor 92 turns on, current can flow from line 72 through transistor 92 and resistor 94 to ground. As a result of this current, the voltage rises across resistor 94. Therefore, node 100, which had been at ground, rises in voltage, providing the ACK signal. The ACK signal resets flip-flop 102, and the Q lead therefore goes low, turning off transistor 82, stopping current through resistor 84, and thus turning off transistor 92. This ends power dissipation.

Transistor 82 is therefore "on" only a little more than the minimum time required to transmit in two directions (i.e. the time necessary to transmit an output transition from the low side to the high side plus the time necessary to transmit an ACK signal back from the high side to the low side) plus the time to switch the fast, low voltage logic that controls transistors 82 and 92. The on time of transistor 92 can be reduced to less than the on time of transistor 82. As a result, the energy dissipated during a transmission cycle can be reduced to between 3 and 4 times the minimum energy required for transmission by conventional level shift circuitry.

The implementation in FIG. 3 is advantageous because it is self-adaptive: If a factor such as process or temperature changes the speed of transmission in circuit 70, the timing of the ACK signal is changed accordingly. Power dissipation may fluctuate, but it will be held at a small multiple of the minimum necessary. The implementation of the present invention advantageously obtains this result without filter delay between the start of transmission and reception of signal; the only unavoidable delay is intrinsic level-shifter delay.

Figure 4:
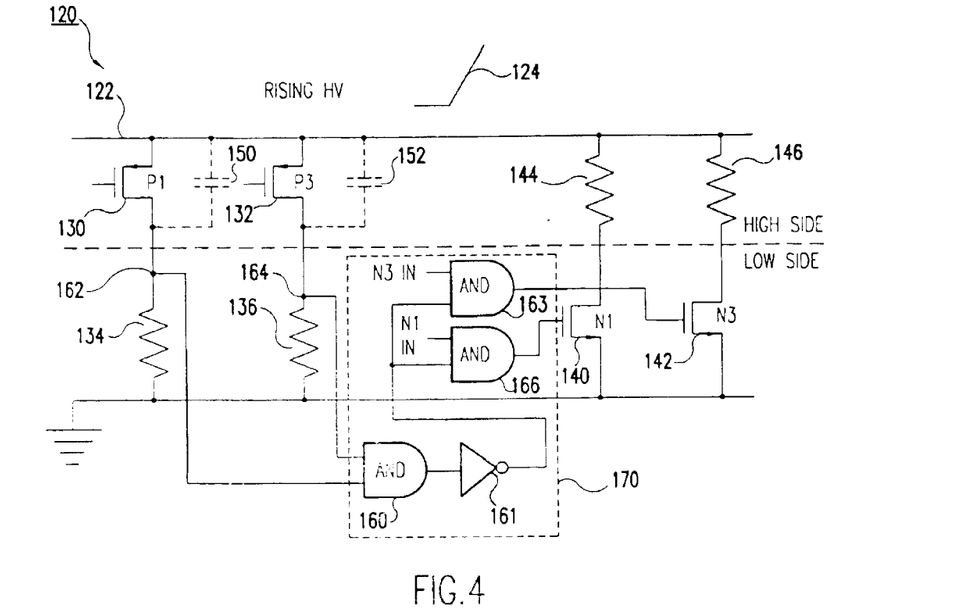

FIG. 4 shows relevant components of a digital level shift circuit 120 of the present invention which alleviates the dv/dt problem by sensing a condition indicating "noisy" dv/dt and, in response, preventing transmission.

In FIG. 4, circuit 120 provides output signals on line 122, on which a rising high voltage is occurring due to a change in $V_{OFFSET}$, as illustrated by waveform 124. Circuit 120 includes a differential circuit formed by two p-channel paths and two n-channel paths between line 122 and ground. The p-channel paths include p-channel transistors 130 and 132 (P1 and P3) connected in series with resistors 134 and 136, respectively. The n-channel paths include n-channel transistors 140 and 142 (N1 and N3) connected in series with resistors 144 and 146, respectively. The input signals at the gates of two transistors of the same channel type obey a protocol under which both transistors are never turned on concurrently.

Circuit 120 also includes circuitry to enforce a transmission protocol preventing concurrent spurious transmission by two devices of the same channel type. FIG. 4 shows only the circuitry that senses the p-channel paths and operates on the low side of circuit 120—similar circuitry could sense the n-channel paths and provide turn-on signals (inverted as appropriate) for p-channel transistors 130 and 132.

Transistors 130 and 132 have parasitic capacitances 150 and 152, respectively, so that current flows through transistors 130 and 132 during non-zero dv/dt on line 122 and voltages appear across resistors 134 and 136. AND gate 160 is connected to receive voltages at nodes 162 and 164. If dv/dt on line 122 is sufficiently high, the voltages at nodes 162 and 164 will both exceed the threshold for a high input to AND gate 160, and the output of AND gate 160 will go high, indicating that AND gate 160 has sensed current above threshold through transistors 130 and 132.

Inverter 161 inverts the output of AND gate 160, and AND gates 163 and 166 each receive the inverted output. AND gate 166 also receives input signals for the gate of transistor 140, while AND gate 163 receives input signals for the gate of transistor 142. These input signals could be any appropriate signals, provided they obey the protocol described above and do not turn on both transistors concurrently.

When the output of AND gate 160 goes high, AND gates 163 and 166 both receive a low signal from inverter 161, and therefore prevent transistors 140 and 142 from receiving turn-on signals. Therefore, transistors 140 and 142 cannot make output transitions and also cannot provide ACK signals as described in relation to FIG. 3. Similar logic circuitry to that shown in dashed lines indicated by reference number 170 is provided on the high side (but not shown in FIG. 4) to sense current above threshold through transistors 140 and 142 and, in response, prevents transistors 130 and 132 from making output transitions and providing ACK signals.

Therefore, during noisy dv/dt situations, all transmissions are disabled and no power dissipation can occur. As will be described more fully below, input information to be level shifted can be stored until a noisy dv/dt event ends.

A mismatch can occur between the current sensing thresholds of the low and high side of circuit 120. For example, the high side might detect high dv/dt when the low side does not because the p-channel devices have less parasitic drain capacitance than the n-channel devices or because the low side current sensing threshold is higher for another reason. But this will not result in an error in translating from the input signals to the output signal, because both sides must be enabled for transmission to continue. Instead, further shifting is simply delayed. If the currently transmitting side does not detect high dv/dt when the non-transmitting side detects it, one of the HV MOS transistors on the transmitting side is turned on but does not receive an ACK signal from the non-transmitting side. Circuit 120 operates properly, but some power is dissipated in one transistor until the high dv/dt event ends and the ACK signal is received.

The technique of FIG. 4 employs four HV MOS transistors and therefore occupies a large amount of silicon. However, the four transistors together can transmit four different signals through low-to-high and high-to-low transitions.

Figure 5:
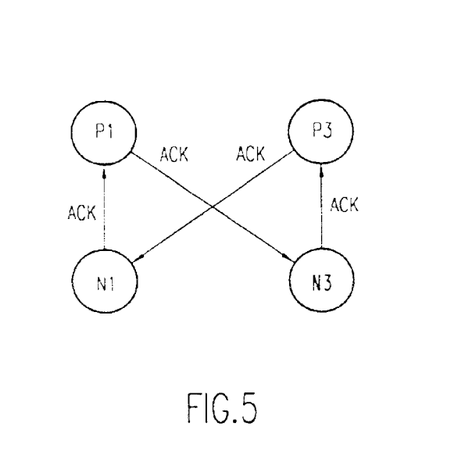
FIG. 5 is a diagram showing how acknowledge signals can be provided in a cross-acknowledgement scheme with two p-channel and two n-channel devices.

FIG. 5 shows one way in which ACK signals can be provided between P1, P3, N1, and N3 in FIG. 4 to avoid a standoff. A standoff could occur if a transistor provided ACK signals to another transistor and also received ACK signals from the same transistor. For example, if P1 and N1 exchanged ACK signals, both might receive turn-on signals concurrently and therefore they would also provide ACK signals to each other concurrently. This is possible because the high and low sides of circuit 120 may not be synchronous-under the protocol described above, concurrent turn-on signals are forbidden only on one side, i.e. P1 and P3 cannot be turned on concurrently, nor can N1 and N3. As between P1 and N1, each could provide an ACK signal to turn off the other before a transition is made, resulting in a standoff in which no transmission is accomplished. Without modification, circuit 120 would be unable to detect the missing transmission.

Under the cross-acknowledgement scheme in FIG. 5, a standoff is avoided because each transistor receives an ACK signal from a transistor other than the one to which it provides an ACK signal. Therefore, circuit 120 can detect transmission errors due to concurrent turn-on signals. For example, if P1 and N1 are turned on at the same time, P1 quickly turns off because it receives an ACK signal from N1, while N1 stays on until it receives an ACK signal from P3 when P3 is turned on due to N1's output transition. Meanwhile, additional circuitry on the high side can detect that P1's output transition has not been made. When P3 provides the ACK signal for N1, this circuitry can respond by turning on P1 to begin a new output transition, resulting in a correct transmission by P1, though slightly postponed in time.

The cross-acknowledgement scheme in FIG. 5 is only one possible scheme that would avoid standoff. Another equally simple scheme would be to simply reverse each arrow in FIG. 5.

Figure 6:
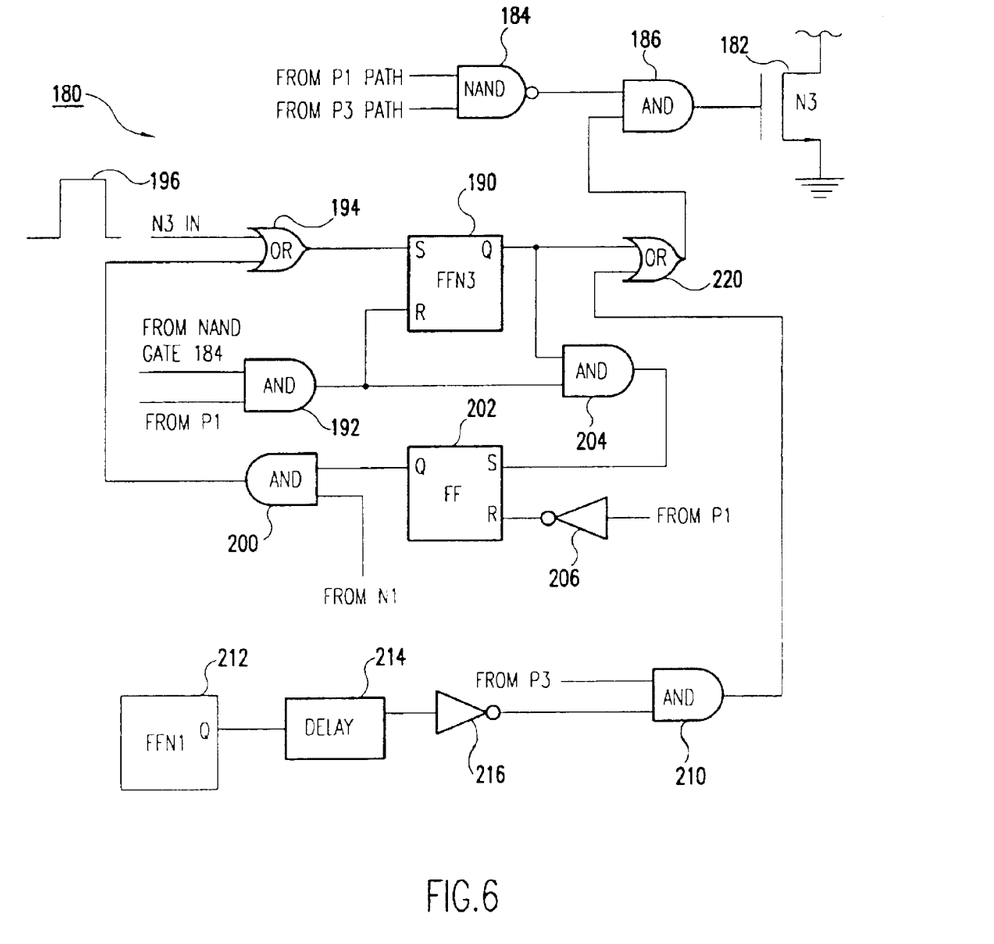
FIG. 6 is a schematic circuit diagram showing a portion of a digital level shift circuit that includes features shown in FIGS. 3–5.

The above techniques can be more fully understood from FIG. 6, showing a portion of level shift circuit 180 that includes features from FIGS. 3–5. The circuitry in FIG. 6 provides turn-on signals to the gate of n-channel transistor 182, labeled N3 in accordance with the scheme shown in FIG. 5. Similar circuitry, with slight modifications such as for p-channel devices, could provide turn-on signals for N1, P1, and P3 in the scheme of FIG. 5.

As described above in relation to gates 160 and 163 in FIG. 4, NAND gate 184 senses current over threshold through P1 and P3, and AND gate 186 prevents N3 from transmitting and from providing an ACK signal. The output of NAND gate 184, corresponding to the output of inverter 161 in FIG. 4, is one input to AND gate 186, and is low only during high dv/dt, disabling N3. The other input to AND gate 186 can thus be referred to as the turn-on signal for N3, and the remaining circuitry in FIG. 6 determines whether to turn N3 on, either in response to a transmission pulse or to provide an ACK signal to P3.

First, flip-flop 190 (FFN3), together with related circuitry, applies a rather complex condition involving both an ACK signal as in FIG. 3 and current sensing as in FIG. 4. The signal from P1, which may be an ACK signal in accordance with FIG. 5, is one input to AND gate, the other input being the output from NAND gate 184, which goes low during high dv/dt. Therefore, FFN3 is reset whenever P1 provides a high output and dv/dt is low. Whenever dv/dt is high or P1 is providing a low output, FFN3 can be set by a high output from OR gate 194, which will occur when N3 receives a transmission pulse, as illustrated by pulse 196.

Even when no transmission pulse is being received, the output from OR gate 194 will go high if the output from AND gate 200 is high. Along lines mentioned above, flip-flop 202 stores information to avoid a standoff with P1, which receives its ACK signal from N1. When P1 provides a high signal and dv/dt is low, FFN3 is reset in response to a high output from gate 192. Due to propagation delay through FFN3, however, both inputs to AND gate 204 can remain momentarily high, so that if FFN3 was set prior to being reset, flip-flop 202 is set to indicate that N3's transmission was stopped by a high signal from P1 which may have been either an ACK signal or a transmission by P1. Flip-flop 202 remains set until the high signal from P1 ends, at which time it is reset when the output from inverter 206 goes high.

While flip-flop 202 is set, its Q lead provides a high signal to AND gate 200, whose other input is the gate signal of N1, which is high when N1 is providing a high output signal. Under the protocol described above, N1 would not be transmitting when N3 is transmitting, so that a high signal from N1 while flip-flop 202 is set must be an ACK signal. Further, if N1 is providing an ACK signal to P1, then the high signal from P1 was not an ACK signal but rather was a transmission in response to an input transmission pulse. If AND gate 200 detects that the high signal from P1 was a transmission, it provides a high output. Due to propagation delay through flip-flop 202, AND gate 200 continues to provide a high output briefly after the high signal from P1 ends, thus setting FFN3 so that N3 can again transmit until an ACK signal is received from P1. In other words, AND gate 200 distinguishes ACK signals from transmissions by P1, and restarts transmission by N3 if the high signal from P1 was a transmission rather than an ACK signal.

Second, AND gate 210, together with related circuitry, applies a condition to ensure that N3 provides appropriate ACK signals to P3. This condition is met whenever P3 provides a high output unless N1 is transmitting—if N1 is transmitting, a high output from P3 must be an ACK signal for N1. Transmission by N1 begins after flip-flop 212 (FFN1) is set, where FFN1 is the counterpart of FFN3 for N1. But if FFN1 is quickly reset to avoid a standoff with P3 in the manner described above, noninverting delay 214, which is slow falling and fast rising, does not provide a high output, and inverter 216 therefore does not provide a low input to AND gate 210. Except when inverter 216 provides a low input, AND gate 210 simply provides P3's output-high output from AND gate 210 indicates that N3 should provide an ACK signal to P3.

Finally, OR gate 220 provides N3's turn-on signal to AND gate 186 if FFN3 is set or if AND gate 210 provides a high output.

The circuitry in FIG. 6, together with counterpart circuitry for N1, P1, and P3, functions as control circuitry, controlling when each device receives its turn-on signals. Some components of the control circuitry function as feedback circuitry as described above; some components function as sense/prevent circuitry as described above; and, since each device receives feedback signals from another device that also transmits, the control circuitry can also include components that distinguish feedback signals from transmissions, as described above in regard to AND gate 200 and related components.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A digital level shift circuit for providing level shifted output signals in response to input pulses defined by a first transition between a first voltage and a second voltage, and a second transition between the second voltage and the first voltage, the circuit comprising:
    a level shifting device that is turned on in response to the first input transition to make an output transition; and
    feedback circuitry that obtains a feedback signal indicating that the level shifting device has made the output transition and that turns off the level shifting device during the interval between the first and second input transitions in response to the feedback signal.

2. The digital level shift circuit of claim 1 in which the level shifting device receives a turn-on signal that turns on the device to make the output transition.

3. The digital level shift circuit of claim 1 in which the output signal voltage range extends from an offset voltage to an upper voltage that is the sum of the offset voltage and a fixed supply voltage; the offset voltage changing rapidly.

4. The digital level shift circuit of claim 1 in which the feedback circuitry includes a feedback device, the feedback device providing the feedback signal by turning on when the level shifting device makes the output transition.

5. The digital level shift circuit of claim 4 in which one of the level shifting device and the feedback device is an n-channel device and the other is a p-channel device.

6. The digital level shift circuit of claim 5 in which the n-channel and p-channel devices are high voltage MOS transistors.

7. A digital level shift circuit for providing level shifted output signals, the circuit comprising:
    first and second n-channel devices that make output transitions in response to turn-on signals; each turn-on signal towing on one of the n-channel devices to make an output transition; the first and second n-channel devices not receiving concurrent turn-on signals;
    first and second p-channel devices that make output transitions in response to turn-on signals; each turn-on signal turning on one of the p-channel devices to make an output transition; the first and second p-channel devices not receiving concurrent turn-on signals; and
    sense/prevent circuitry that senses when current greater than a threshold flows through both of the first and second devices of one channel type and, in response, prevents output transitions from being made.

8. The digital level shift circuit of claim 7 in which the n-channel and p-channel devices are high voltage MOS transistors.

9. The digital level shift device of claim 7 in which the sense/prevent circuitry prevents output transitions by preventing the first and second devices of the other channel type from receiving turn-on signals.

10. The digital level shift circuit of claim 7 in which each of the devices of one channel type has a series resistance, each device and its series resistance being connected in series between an output signal line and a common voltage; the sense/prevent circuitry including sensing logic that receives voltages from first and second nodes and that can provide a prevent signal to prevent output transitions from being made; the first node being between the first device and its series resistance and the second node being between the second device and its series resistance, the sensing logic providing the prevent signal only when the voltages at the first and second nodes indicate that current is flowing through the series resistances of both the first and second devices.

11. The digital level shift circuit of claim 10 in which the sense/prevent circuitry further includes prevent logic that receives the prevent signal and, in response, prevents the first and second devices of the other channel type from receiving turn-on signals.

12. The digital level shift circuit of claim 11 in which the sensing logic includes an AND gate connected to receive the voltages at the first and second nodes and an inverter on the output of the AND gate and in which the prevent logic includes first and second AND gates each connected to receive the prevent signal from the inverter, the first AND gate also receiving the turn-on signals for the first device of the other channel type and the second AND gate also receiving the turn-on signals for the second device of the other channel type.

13. The digital level shift circuit of claim 11 in which the sensing logic includes an NAND gate connected to receive the voltages at the first and second nodes and an AND gate connected to receive the prevent signal from the NAND gate, the AND gate also receiving the turn-on signals for the first device of the other channel type.

14. A digital level shift circuit for providing level shifted output signals, the circuit comprising:

first and second n-channel devices that make output transitions in response to turn-on signals; each turn-on signal turning on one of the n-channel devices to make an output transition; the first and second n-channel devices not receiving concurrent turn-on signals;

first and second p-channel devices that make output transitions in response to turn-on signals; each turn-on signal turning on one of the p-channel devices to make an output transition; the first and second p-channel devices not receiving concurrent turn-on signals; and control circuitry that controls when each device receives its turn-on signals; the control circuitry including:

feedback circuitry that obtains a feedback signal for each device indicating that the device has made an output transition and that stops the device's turn-on signal in response to the feedback signal; and sense/prevent circuitry that senses when current above a threshold flows through both of the first and second devices of one channel type and, in response, prevents output transitions from being made.

15. The digital level shift circuit of claim 14 in which the n-channel and p-channel devices are high voltage MOS transistors.

16. The digital level shift circuit of claim 14 in which the sense/prevent circuitry prevents output transitions by delaying the first and second devices of the other channel type from receiving turn-on signals; the sense/prevent circuitry further including, for each device, a storage element that stores the device's turn-on signal until the prevent signal ends and the device's feedback signal is received.

17. The digital level shift circuit of claim 14 in which the sense/prevent circuitry further includes, for each device, a storage element that stores a transmission pulse to the device until the prevent signal ends and the device's feedback signal is received.

18. The digital level shift circuit of claim 14 in which the feedback circuitry obtains the feedback signal for each device of one channel type from one of the devices of the other channel type, with none of the devices receiving its feedback signal from a device whose feedback signal it provides.

19. The digital level shift circuit of claim 18 in which the first n-channel device provides the first p-channel device's feedback signal, the first p-channel device provides the second n-channel device's feedback signal, the second n-channel device provides the second p-channel device's feedback signal, and the second p-channel device provides the first n-channel device's feedback signal.

20. The digital level shift circuit of claim 18 in which the control circuitry further includes:

feedback detection circuitry for each device to distinguish feedback signals from transmissions.

21. The digital level shift circuit of claim 17 in which the feedback detection circuitry for a device includes an AND gate that determines whether a signal from another device was received when the other device was receiving a feedback signal in response to a transmission.

* * * * *